(12) United States Patent
Gwinn

(10) Patent No.: US 12,733,442 B2
(45) Date of Patent: Sep. 8, 2026

(54) PROCESS SYSTEM, METHOD, AND SUBSTRATE CHUCK

(71) Applicant: Tokyo Electron Limited, Tokyo (JP)

(72) Inventor: Matthew Charles Gwinn, Winchendon, MA (US)

(73) Assignee: Tokyo Electron Limited, Tokyo (JP)

( * ) Notice: Subject to any disclaimer, the term of this patent is extended or adjusted under 35 U.S.C. 154(b) by 442 days.

(21) Appl. No.: 18/350,610

(22) Filed: Jul. 11, 2023

(65) Prior Publication Data

US 2025/0022739 A1 Jan. 16, 2025

(51) Int. Cl.
*H10P 72/72* (2026.01)
*H10P 72/00* (2026.01)
*H10P 72/30* (2026.01)

(52) U.S. Cl.
CPC ........ *H10P 72/722* (2026.01); *H10P 72/0421* (2026.01); *H10P 72/0432* (2026.01); *H10P 72/3302* (2026.01)

(58) Field of Classification Search
CPC ............... H10P 72/722; H10P 72/3302; H10P 72/0432; H10P 72/0421
See application file for complete search history.

(56) References Cited

U.S. PATENT DOCUMENTS 6,229,118 B1 * 5/2001 Kim ........................ H10P 72/78 118/724
10,361,099 B2 * 7/2019 Waqar ..................... H10P 72/04
2003/0123958 A1 * 7/2003 Sieradzki ............ H10P 72/3304 414/217
2004/0052963 A1 3/2004 Ivanov et al.
2005/0163598 A1 * 7/2005 Yuasa ................. H10P 72/3306 414/217
2008/0220622 A1 9/2008 Goodman et al.
2014/0262035 A1 * 9/2014 Merry ................. H10P 72/0462 156/345.31
2014/0262036 A1 * 9/2014 Reuter ................ H10P 72/0458 156/345.31
2016/0211162 A1 7/2016 White et al.
2021/0335642 A1 * 10/2021 Gwinn .................... H01J 37/20
2023/0021625 A1 1/2023 Siefering et al.
2023/0257869 A1 8/2023 Deniz et al.
2023/0420274 A1 12/2023 Siefering

FOREIGN PATENT DOCUMENTS

CN 1965105 A 5/2007
CN 115836141 A 3/2023
KR 101458864 B1 11/2014

OTHER PUBLICATIONS

International Search Report and Written Opinion, PCT/US2024/029964, Mailed Sep. 5, 2024, Total pp. 09.

* cited by examiner

*Primary Examiner* — Scott Bauer
(74) *Attorney, Agent, or Firm* — Slater Matsil, LLP

(57) ABSTRACT

An embodiment apparatus includes a processing chamber and an equipment housing; a processing tool in the equipment housing with a process nozzle projecting into the processing chamber; a substrate chuck for supporting a wafer disposed in the processing chamber. The apparatus includes a docking station in the processing chamber configured to reset a temperature of the substrate chuck when the wafer is docked in a docking position; and a chuck arm in the processing chamber. The chuck arm is configured to move the wafer under the process nozzle and to move the wafer to the docking position.

20 Claims, 11 Drawing Sheets

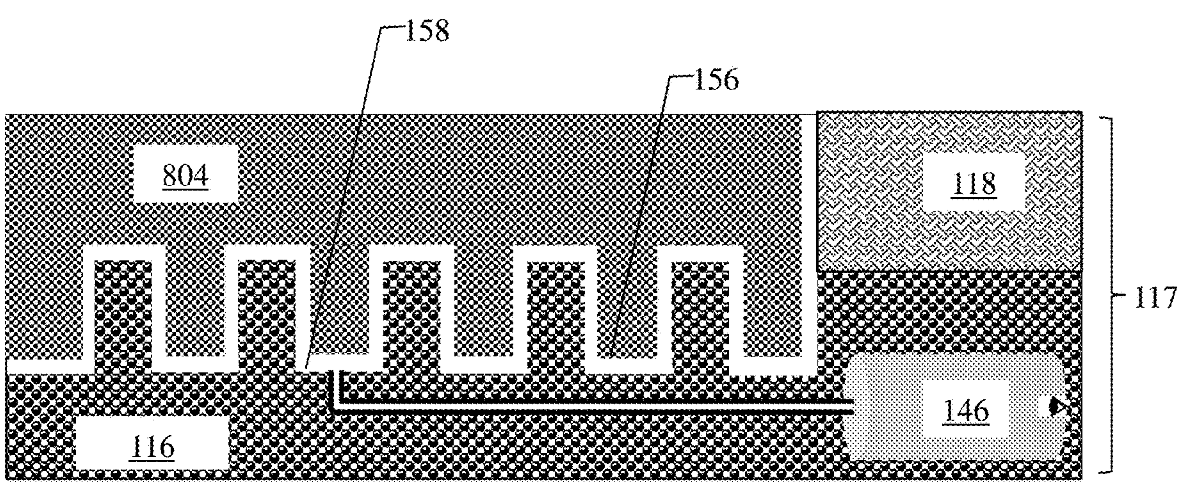
FIG. 8
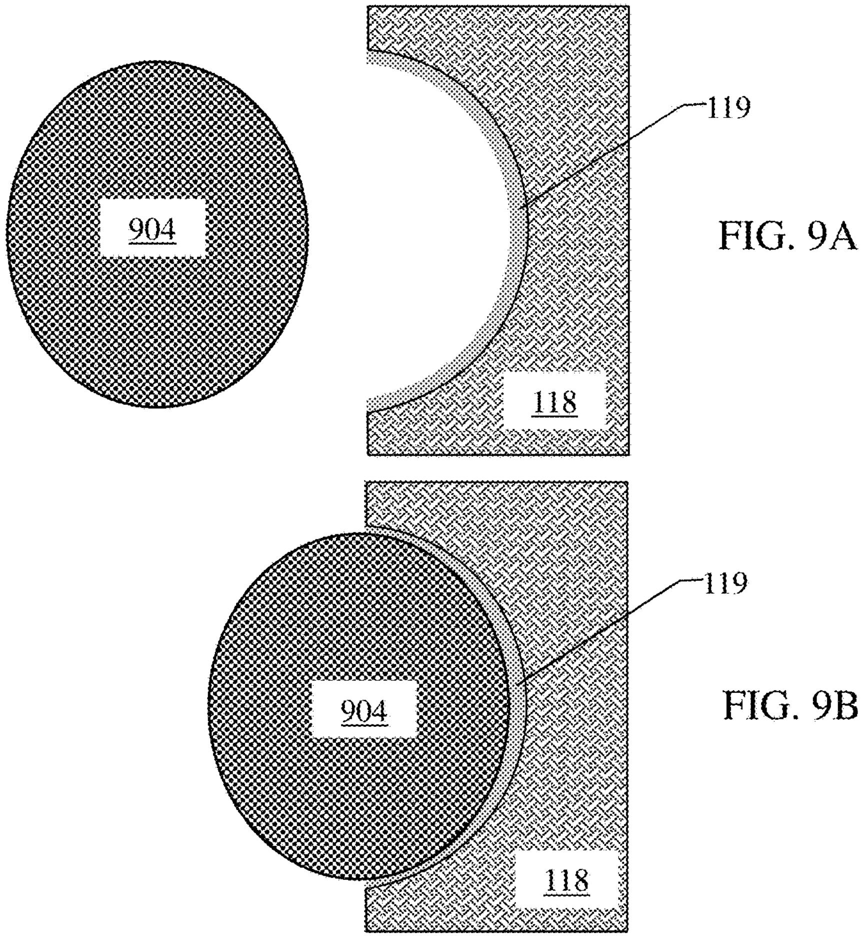
FIG. 9A
FIG. 9B

PROCESS SYSTEM, METHOD, AND SUBSTRATE CHUCK

TECHNICAL FIELD

The invention relates generally to the field of semiconductor processing and in particular embodiments, to methods, apparatuses, and systems for moving a substrate in a process system.

BACKGROUND

Semiconductor device manufacturing generally involves a series of manufacturing techniques including formation, patterning, and removal of a number of layers of material on a substrate. Maintaining the temperature of the substrate during processing can be important during device formation as processing the substrate may also change the temperature of the chuck. Change in wafer temperature during processing as well as temperature non-uniformity across a wafer can lead to device defects, variability, and failure. Heat may be added to or radiated away from a wafer and the wafer chuck causing them to heat up or cool down during processing.

In some processing techniques, instead of processing the entire substrate simultaneously, a selected portion of the substrate is processed. For example, during a location-specific process, the surface of a substrate may be exposed to a focused beam. In such location-specific processes, the beam is scanned across the substrate surface until the entire surface of the substrate is processed. Temperature changes that may occur during the scanning process may change critical properties. For example, if the temperature changes across the wafer during a location-specific etching process, the critical dimension and sidewall slope and profile on critical geometries may change across the wafer. Additionally, when the location specific process adds heat to the wafer chuck faster than it is radiated away during processing, wafer-to-wafer temperature may change as additional wafers are processed until an equilibrium temperature is reached.

SUMMARY

An apparatus includes a processing chamber and an equipment housing; a processing tool in the equipment housing with a process nozzle projecting into the processing chamber; a substrate chuck for supporting a wafer disposed in the processing chamber. The apparatus includes a docking station in the processing chamber configured to reset a temperature of the substrate chuck when the wafer is docked in a docking position; and a chuck arm in the processing chamber. The chuck arm is configured to move the wafer under the process nozzle and to move the wafer to the docking position.

A method of processing wafers includes loading a first wafer onto a substrate chuck in a processing system, the processing system including a process nozzle, the substrate chuck, and a docking station. The method includes docking the substrate chuck with the docking station, the docking including moving the substrate chuck to a docketing position and setting a temperature for the substrate chuck. The method includes moving a surface of the first wafer under the process nozzle; unloading the first wafer; loading a second wafer onto the substrate chuck. The method includes repeating the docking, the moving, and the unloading to process the second wafer.

A substrate chuck includes a high heat capacity substrate to support a wafer during processing; and a coating covering a portion of a surface of the substrate chuck, the coating including a thermal blocking material to reduce radiative heat loss.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates cross-sectional block diagram of a substrate chuck and a docking station with corrugated surface area enhancement in accordance with embodiments;

FIGS. 9A and 9B illustrate top-down views of a docking station with conformable thermal transfer material in accordance with embodiments;

DETAILED DESCRIPTION OF ILLUSTRATIVE EMBODIMENTS

Figure 1A:
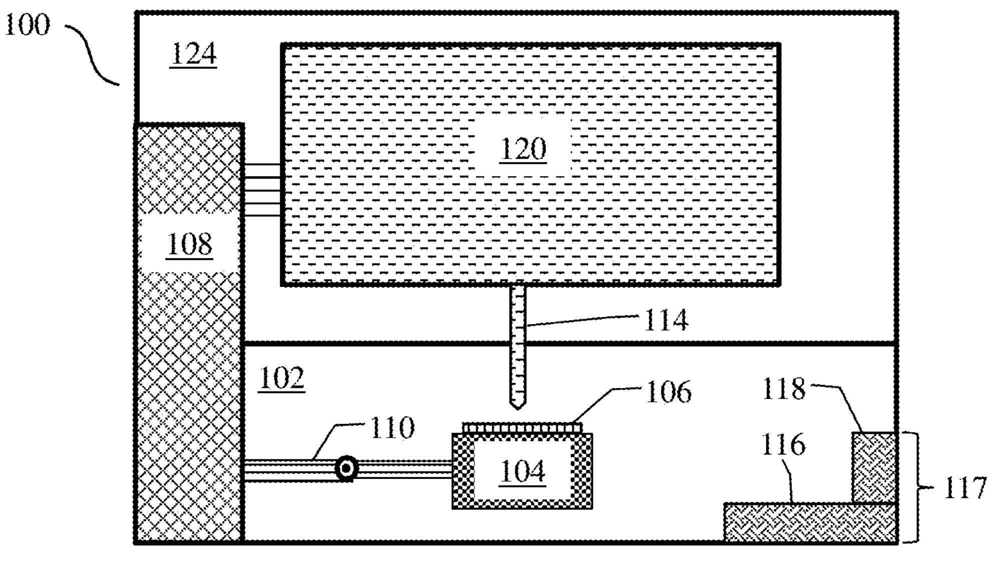
FIGS. 1A and 1B illustrate a cross-sectional block diagram and a top-down block diagram of a location-specific process system in accordance with embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, when this application describes substrate chucks and methods of processing wafers through location-specific process systems using embodiment substrate chucks it will be apparent to persons skilled in the art that similar substrate chucks could be employed, and similar methods used to process wafers through the location-specific process systems described herein.

Location-specific processing systems can either move a location-specific process nozzle across a stationary wafer by moving the location-specific processing tool or can move the wafer on a mobile substrate chuck under a stationary location-specific processing tool. The cost and footprint of the location-specific processing system may be reduced by moving the wafer instead of moving the location-specific processing tool. Location-specific processes typically add heat during processing. If more heat is added to the substrate chuck than is radiated away, the substrate chuck and wafer heat up. If less heat is added to the substrate chuck than is radiated away, the substrate chuck and wafer cool down. Keeping the temperature of a mobile substrate chuck constant may be challenging. A heater may be embedded in the substrate chuck and coupled to sensors, a power source, and a controller. The substrate chuck may be designed to radiate heat away faster than heat is added by the process. Gas may flow across the backside of the wafer to heat or cool the wafer. Liquid or gas channels may be provided in the chuck to heat or cool the substrate chuck. Coupling gas channels and liquid channels from a stationary process controller unit to the mobile substrate chuck requires flexible hoses, rotary valves and other parts that tend to generate particles, are difficult to maintain, tend to be unreliable, and are expensive. Substrate chucks designed to radiate heat faster than heat is added by a process must include a chuck heater, sensors, and feedback loops to keep the chuck temperature constant while processing a single wafer and while processing multiple wafers.

Embodiment substrate chucks herein are designed to maintain substrate chuck temperature within a specified range throughout a process. After processing a wafer, the embodiment substrate chuck may be docked in a docking station and the temperature of the chuck may be reset. Embodiment substrate chucks may be constructed with sufficient mass of a high heat capacity material to maintain temperature within a specified range during processing. In addition, surfaces of the embodiment substrate chuck may be designed to minimize radiative heat loss. Embodiment substrate chucks reduce the cost and complexity of location-specific processing systems as well as improve reliability and uptime.

Figure 1B:
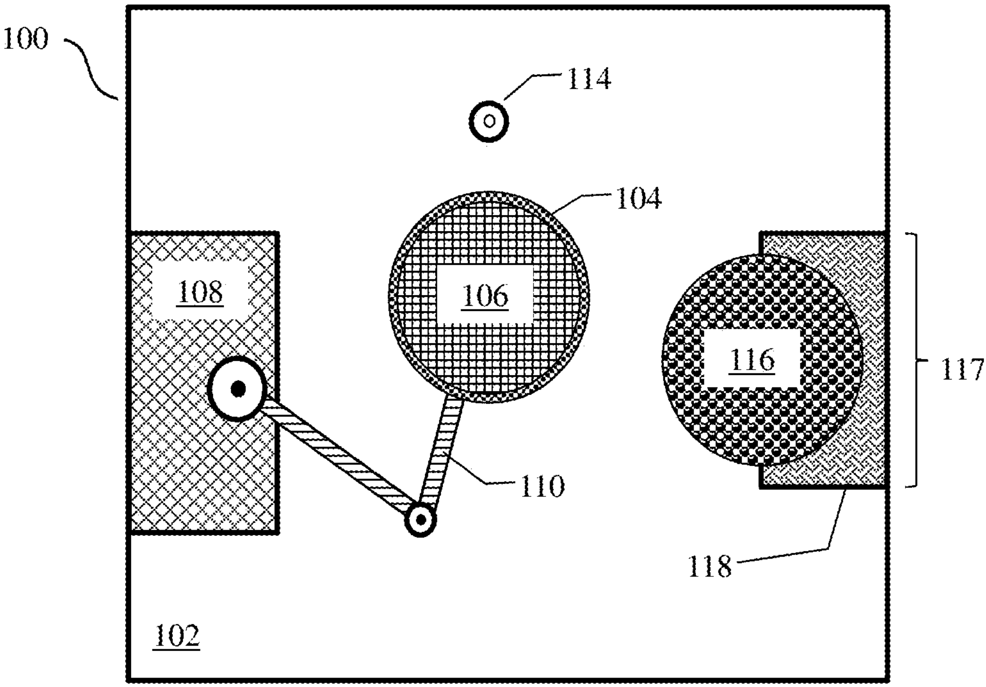

An embodiment location-specific processing system 100 with an embodiment substrate chuck 104 is illustrated in the cross-sectional, block diagram view in FIG. 1A and in the top down, block diagram view in FIG. 1B.

The location-specific processing system 100 in FIG. 1A is comprised of a process chamber 102 and an equipment housing 124. In an embodiment, the location-specific processing system may be a plasma tool such as a plasma etching tool, burnishing tool, an ion-milling tool, or deposition tool including a sputter deposition tool.

A location-specific nozzle 114 on the location-specific process apparatus 120 in the equipment housing 124 projects into the processing chamber 102. The location-specific process apparatus 120 is held stationary in the equipment housing 124. A chuck arm 110 driven by a process controller 108 in the location-specific processing system 100 scans the substrate chuck 104 under the location-specific nozzle 114. This configuration may provide a reduced footprint and reduced cost when compared with processing systems in which the substrate chuck is stationary and the process apparatus 120 is scanned.

A process controller 108 in the location-specific processing system 100 controls the location-specific process apparatus 120 in the equipment housing 124 controls the chuck arm 110 that moves the substrate chuck 104 under the location-specific nozzle 114 and controls the docking station 117. The process controller 108 may be a general computer, microcontroller, or other circuitry capable of controlling the various processing tools. The process controller 108 may be located in one place or may be part of a distributed system.

The location-specific nozzle 114 treats a localized spot on the surface of wafer 106. The location-specific nozzle 114 may be a nozzle for a burnishing tool, ion milling tool, or a nozzle coupled to a remote plasma chamber. The chuck arm 110 moves, e.g., scans, the substrate chuck 104 under the location-specific nozzle 114 until a portion of or the entire surface of the wafer 106 is treated.

A docking station 117 with side-chuck docking station 118 or a bottom-chuck docking station 116 or both is also housed in processing chamber 102 and coupled to process controller 108. Between processing scans, the chuck arm 110 may dock the substrate chuck 104 in the docking station 117 to reset substrate chuck 104 parameters such as the chuck temperature.

FIG. 1B is a top-down view of processing chamber 102. Location-specific nozzle 114 is coupled to the location-specific process apparatus 120 in the equipment housing 124. Chuck arm 110, attached to the substrate chuck 104 and driven by the process controller 108, moves the substrate chuck 104 under the location-specific nozzle 114 to process the surface of the wafer 106.

Before processing a wafer 106, the chuck arm 110 may dock the substrate chuck 104 in the docking station 117 and reset substrate chuck parameters. For example, while in the docking station 117, the temperature of the substrate chuck 104 may be set to a process temperature by conductive heat transfer from the side-chuck docking station 118, conductive heat transfer from the bottom-chuck docking station 116, or conductive heat transfer from both.

In an example, the process may add more heat to the substrate chuck 104 than is radiated away causing the substrate chuck 104 and wafer 106 to heat up. In this instance the temperature of the substrate chuck 104 may be set near the bottom of the processing temperature range prior to processing the wafer 106.

In another example, the process may add less heat to the substrate chuck 104 than is radiated away causing the substrate chuck 104 and wafer 106 to cool. In this instance the temperature of the substrate chuck 104 may be set near the top of the processing temperature range.

In various embodiments, the embodiment substrate chuck 104 is designed to maintain the temperature of the wafer 106 within a specified range throughout the process.

Figure 2A:
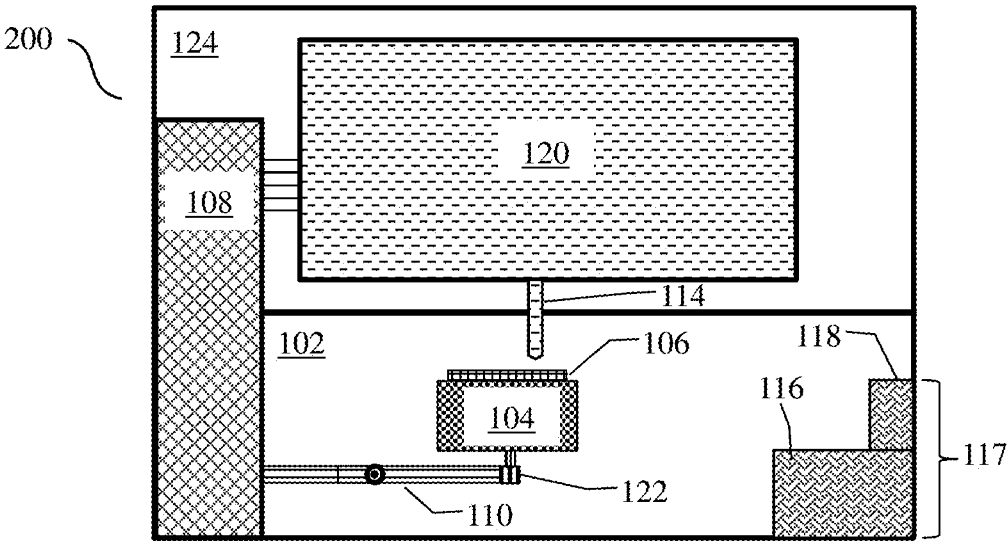
FIGS. 2A and 2B illustrate a cross-sectional block diagram and a top-down block diagram of a location-specific process system in accordance with embodiments.
Figure 2B:
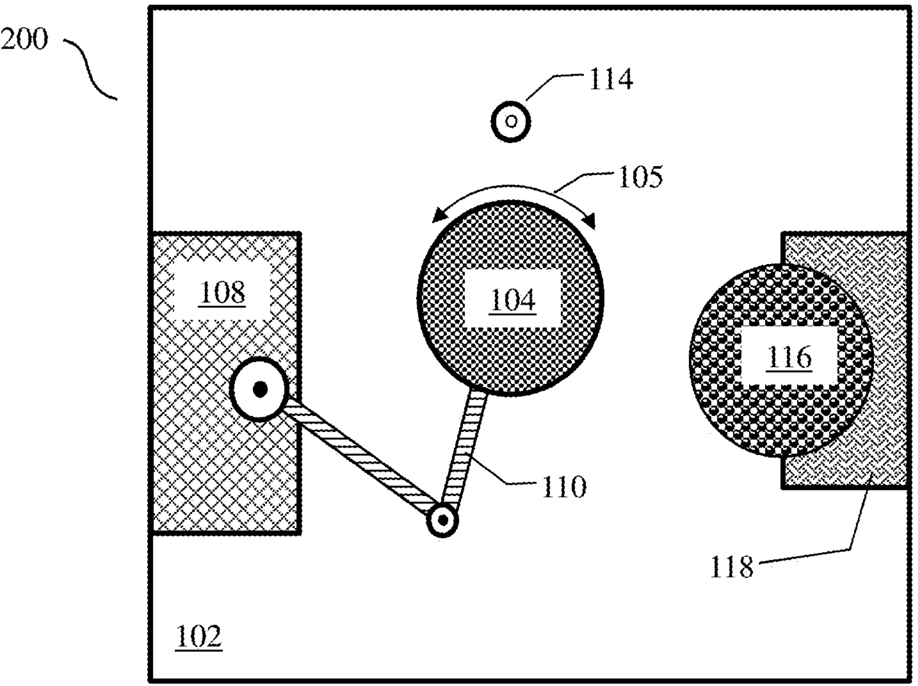

The cross-sectional, block diagram view in FIG. 2A and the top down, block diagram view in FIG. 2B describe another embodiment location-specific processing system 200 with a substrate chuck 104.

A rotation device 122 such as a motor below the substrate chuck 104 near the end of the chuck arm 110 may rotate the substrate chuck 104 during processing. The substrate chuck 104 may be coupled to a rotating shaft of the motor so that the substrate chuck is configured to rotate in response to the rotation of the rotating shaft. During processing of the wafer, the process controller 108 may control the rotation speed of the substrate chuck 104 and may control the lateral speed of the wafer 106 as it is scanned under the location-specific nozzle 114 so that the dwell time of the location-specific process is constant from the center to the edge of the wafer 106.

Figure 3A:
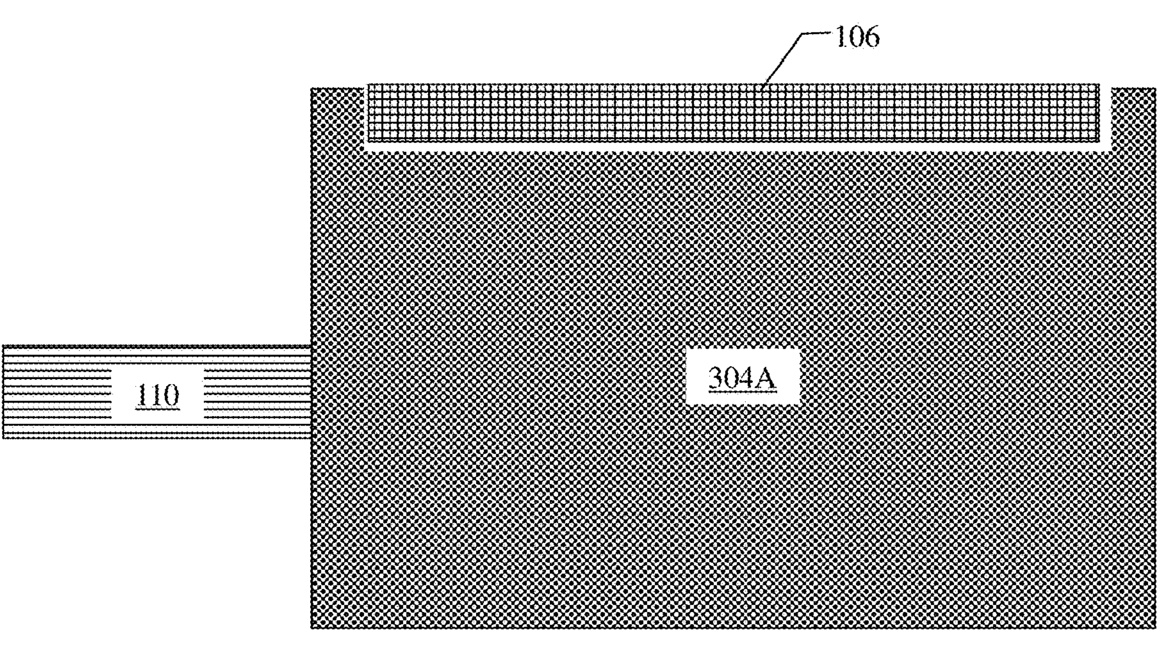
FIGS. 3A and 3B illustrate cross-sectional views of substrate chucks in accordance with embodiments.
Figure 3B:
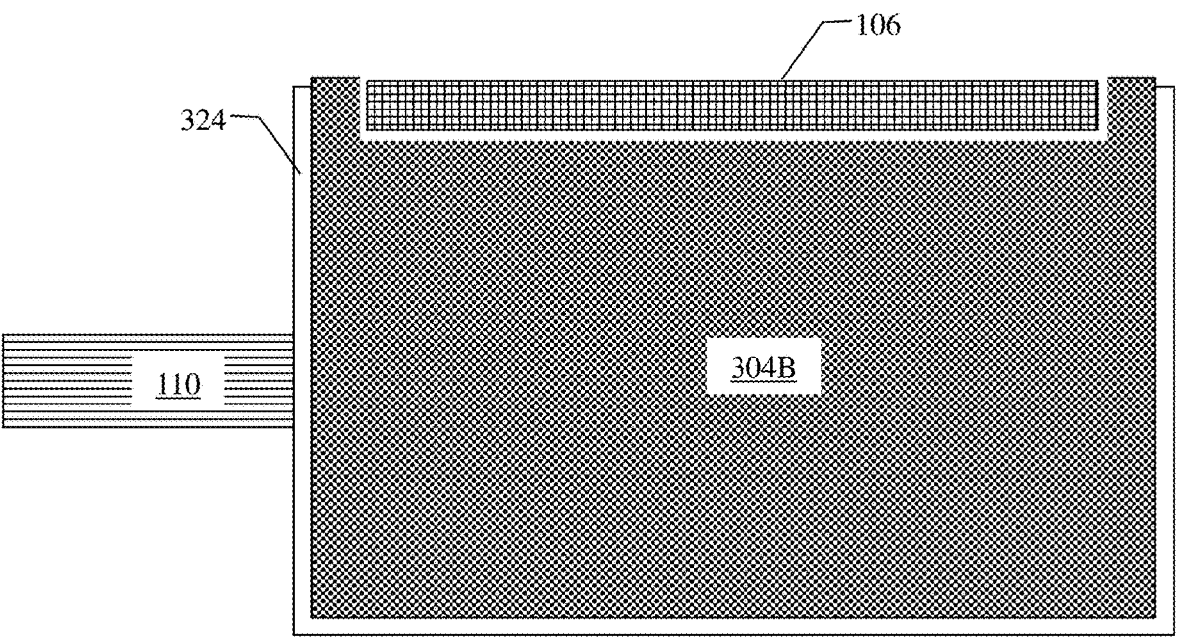

FIGS. 3A and 3B are cross-sectional views of embodiment substrate chuck 304 in accordance with embodiments. The substrate chucks 304A and 304B may be similar to the embodiments of FIGS. 1A-2B but may also have sufficient mass of a material having a high heat capacity and with surfaces that minimize heat loss due to radiation so that the temperature of the substrate chucks 304A and 304B may be maintained within a specified range during processing. In various embodiments, the substrate chucks 304A-304B have a higher heat capacity than the wafer by a factor of at least two. Materials used in forming the substrate chuck 304A-304B in FIGS. 3A and 3B with a high heat capacity may include metals such as aluminum including aluminum composites such as AlBeMet, brass, stainless steel including super austenitic stainless steel such as Incoloy. Generally, the heat capacity is enough when the heat transfer to/from the wafer maintains the wafer within the process window for the process and the rate of heat transfer is sufficient due to the change in temperature to maintain the temperature of the wafer.

The surface of the substrate chuck 304A in FIG. 3A may be polished. This is because smooth surfaces radiate less heat than non-smooth surfaces. In an example, the surface of the substrate chuck 304A may be polished to ensure an emissivity of 0.7 or less.

In FIG. 3B, additionally, the sides and bottom of the substrate chuck 304B may be coated with a low thermal emissivity coating 324 to reduce heat loss due to radiation. Light colored surfaces emit less thermal radiation than dark colored surfaces, so it is preferable for the substrate chuck 104 surface to be a light color. In an embodiment, the low thermal emissivity coating 324 may comprise aluminum oxide such as $Al2O3$ flame spray or similar substance that is both whitish in color and inherently smooth.

Figure 4:
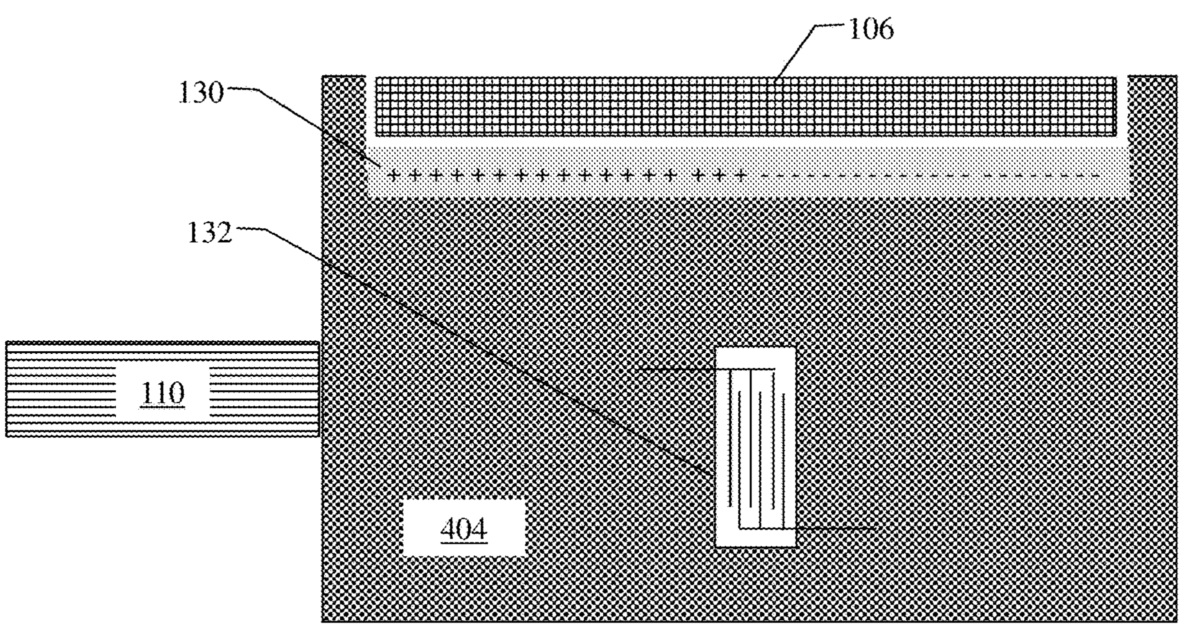
FIGS. 4 and 5 illustrate cross-sectional views of substrate chucks in accordance with embodiments.

FIG. 4 illustrates a cross-sectional view of an embodiment electrostatic substrate chuck in accordance with an embodiment.

The electrostatic substrate chuck 404 of this embodiment may be similar to the prior embodiments but in addition may include electrostatic electrodes 130, which may be embedded in a dielectric material that electrically isolates the electrostatic electrodes 130 from the metallic substrate chuck 404 and from the wafer 106. The electrostatic electrodes 130 are positioned close to the underside of wafer 106 for better clamping. Electrostatic voltages may be supplied to the electrostatic electrodes 130 from storage capacitors 132 in the substrate chuck 404. Alternatively, electrostatic voltages may be supplied to the electrostatic electrodes 130 via wires from the process controller 108 through the chuck arm 110.

Figure 5:
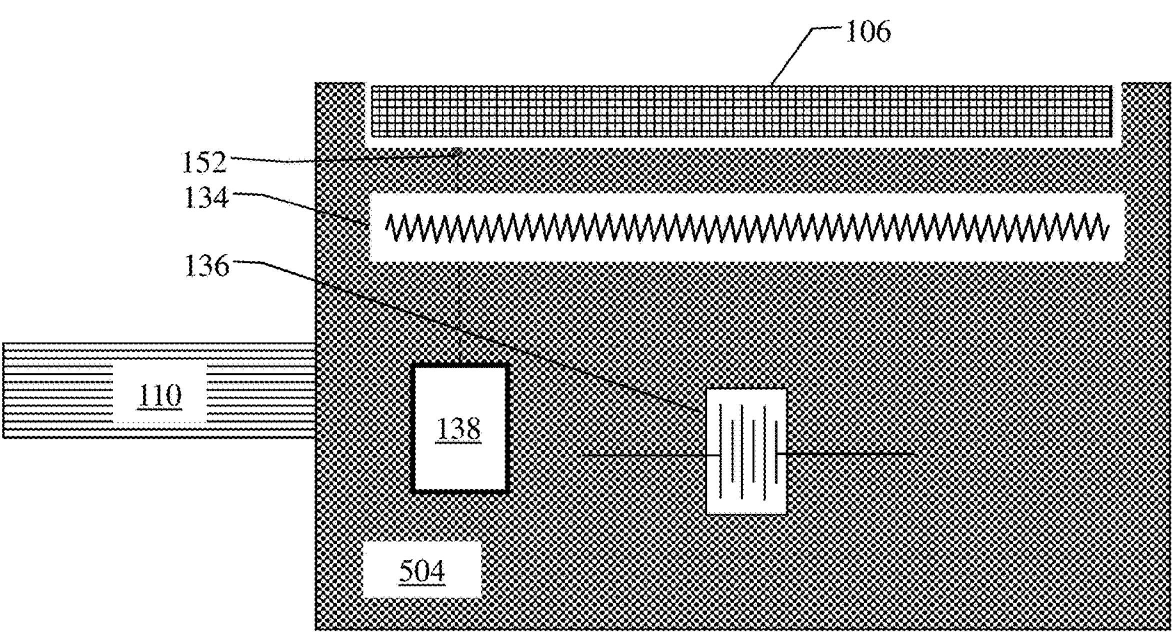

FIG. 5 illustrates a cross-sectional view of an embodiment electrostatic substrate chuck in accordance with an embodiment.

The substrate chuck 504 of this embodiment may be similar to the prior embodiments but in addition may include an embedded chuck heater 134. Electrical power may be supplied to the chuck heater 134 from a rechargeable battery 136 in the substrate chuck 504 that is configured to recharge in the docked position wirelessly. The rechargeable battery 136 may also be recharged in the docked position through pins located on the sides of the substrate chuck 504 with wires coupling the pins to the rechargeable battery 136.

Alternatively, electrical power may be supplied to the chuck heater 134 via wires from process controller 108. In an example, this may be performed through a chuck component such as a chuck arm 110.

A sensor/temperature controller 138 in the substrate chuck 504 may be coupled to a temperature sensor 152 that senses the rate of cooling of the substrate chuck 504 and adjusts power to the chuck heater 134 to keep temperature within the specified range. Alternatively, data from the temperature sensor 152 may be conveyed via a wire through the chuck arm 110 to the process controller 108 which in turn may adjust power to the chuck heater 134.

Figure 6A:
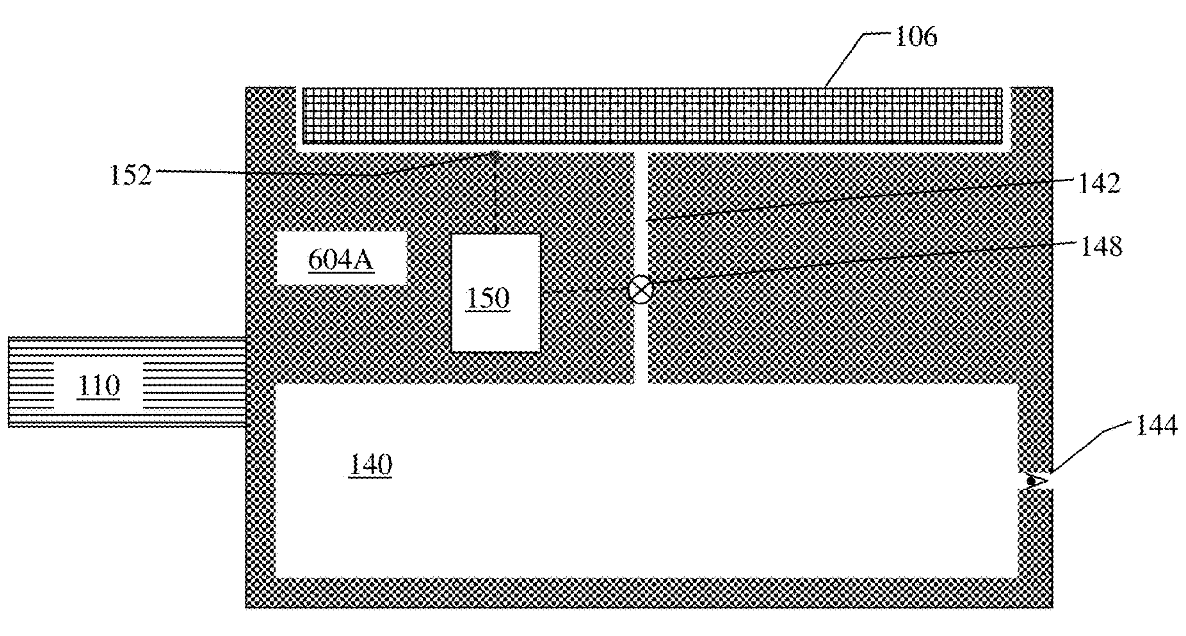
FIGS. 6A and 6B illustrate cross-sectional views of substrate chucks with plenums in accordance with embodiments.
Figure 6B:
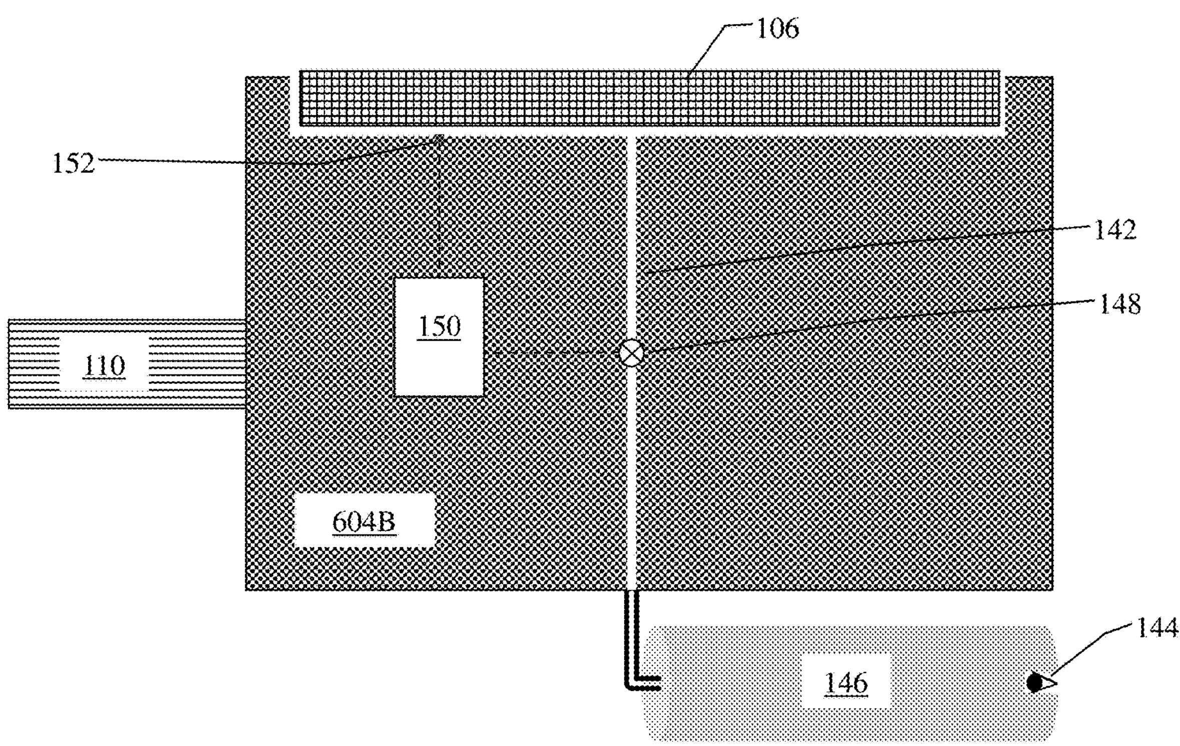

In some applications, gas may be flowed across the backside of the wafer to facilitate heat transfer. The gas may either heat or cool the wafer 106. FIGS. 6A and 6B are cross-sectional views illustrating embodiments with plenums coupled to the substrate chuck. The substrate chucks 604A/604B of this embodiment may otherwise be similar to the prior embodiments.

The gas plenum 140 may provide a thermal transfer gas during processing. Providing gas to the backside of the wafer 106 through the chuck arm 110 requires flexible gas hoses, rotating gas valves, and other parts which tend to generate particles, are difficult to maintain, and are costly. The embodiment substrate chuck 604A with an internal gas plenum 140 in FIG. 6A or the embodiment substrate chuck 604A with an external gas plenum 146 in FIG. 6B, simplify the design of a location-specific processing system 100, is less costly, and more reliable, than location-specific processing systems with the gas supplied through the chuck arm 110.

A microcontroller 150 in the substrate chuck 104 may receive data from a temperature sensor 152 in the substrate chuck 104 and send control signals to a gas valve 148 in the gas channel 142 between the gas plenum 140 or gas valve 148, and the backside of the wafer 106 to adjust the gas flow, which helps to maintain temperature. Alternatively, wires may run through the chuck arm 110 from the temperature sensor 152 to the process controller 108 and from the process controller 108 back to the gas valve 148 to adjust the gas flow.

After processing a first wafer and prior to processing a second wafer the chuck arm 110 may dock the substrate chuck 104 in the docking station 117 to reset parameters of the substrate chuck 104. For example, while the substrate chuck 104 is docked, the temperature of the substrate chuck 604A/604B may be reset, the gas in the plenum, 140 or 148, may be replenished, the battery 136 that supplies power to the chuck heater 134 (FIG. 5) may be recharged, and the storage capacitors 132 (FIG. 4) that supply voltages to the electrostatic electrodes 130 may be recharged.

Figures 7A, 7B:
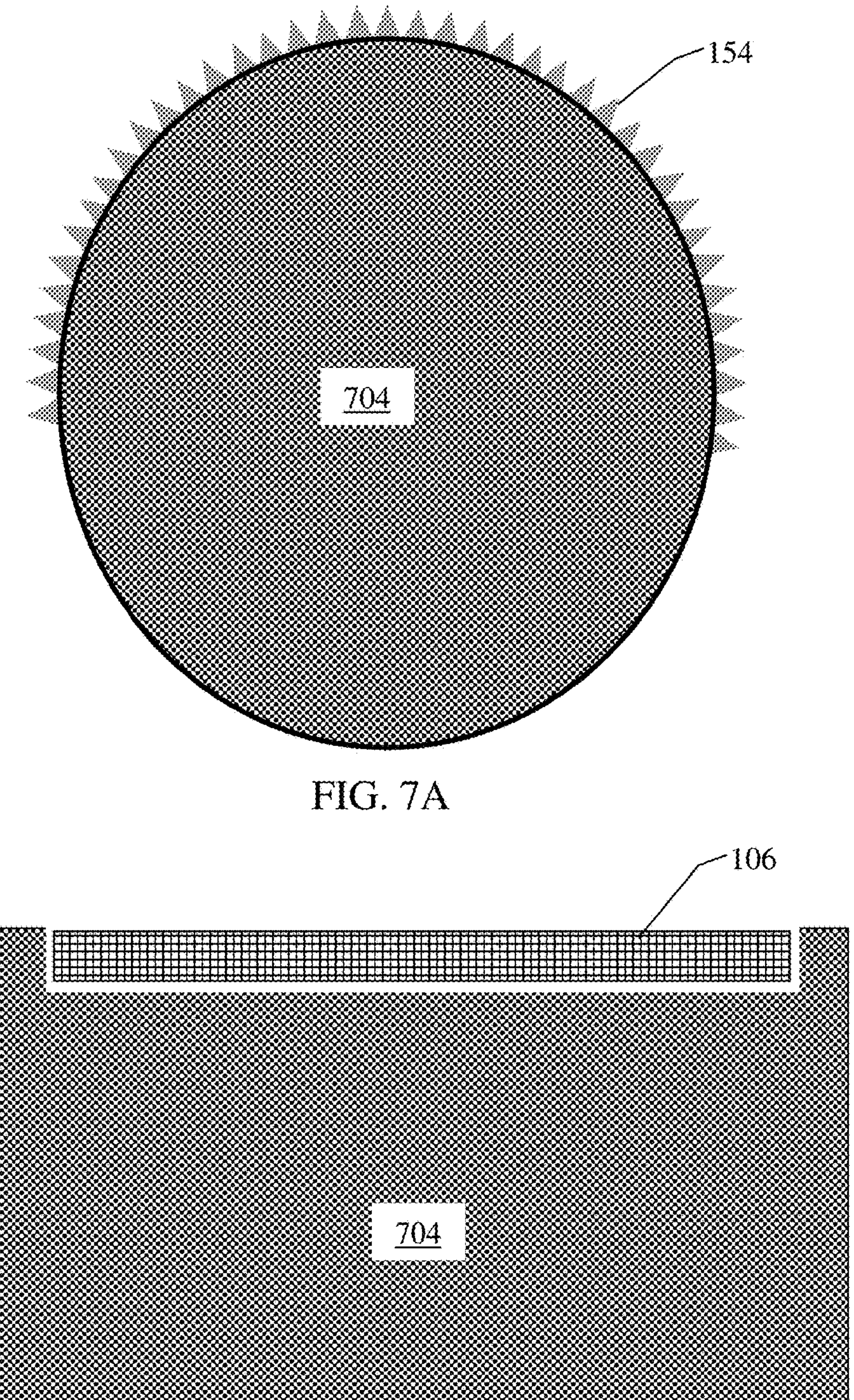
FIGS. 7A and 7B illustrate a top-down view, a cross-sectional view of substrate chucks with corrugated surface area enhancement in accordance with embodiments.

To speed up the process of resetting the temperature of the substrate chuck, the surface area between the substrate chuck and the docking station 117 may be increased to facilitate heat transfer by conduction. FIGS. 7A and 7B, and FIG. 8 illustrate example embodiment substrate chucks with increased surface area.

FIG. 7A is a top-down view of a substrate chuck 704 with corrugations 154 that increase surface area on the side of the substrate chuck 704. The substrate chuck 704 of this embodiment may otherwise be similar to the prior embodiments.

Corrugated surface 154 may be polished smooth or covered with a coating that reduces thermal radiation. The corrugated surface may enhance thermal heat transfer between the substrate chuck 704 and side-chuck docking station 118. The smooth or coated surface may provide a minimal increase in thermal heat loss from radiation due to the increased surface area.

FIG. 7B is a cross-sectional view of a substrate chuck 704 with corrugations 156 that increase surface area on the bottom of the substrate chuck 104. Corrugated surface 156 may be polished smoothly or covered with a coating to reduce thermal radiation. The corrugated surface 156 may enhance thermal heat transfer between the substrate chuck 704 and bottom-chuck docking station 116.

FIG. 8 is a cross-sectional view of a portion of the substrate chuck 804 with bottom corrugations 156 and bottom-chuck docking station 116. The substrate chuck 804 of this embodiment may otherwise be similar to the prior embodiments.

The corrugations 156 increase the contact area between the substrate chuck 104 and the bottom-chuck docking station 116 to increase heat transfer by conduction. This reduces the time required to reset the temperature of the substrate chuck 804 and therefore shortens cycle time. As illustrated in FIG. 8, the time required to reset the temperature of the substrate chuck 804 may be additionally reduced by flowing a heat transfer gas between the corrugations 156 in the substrate chuck 104 and the corrugations 158 in the bottom-chuck docking station 116. The gas may be supplied from plenum 146 in the docking station 117 or from an alternative gas source coupled to the docking station 117. In some embodiments, the docking station 117 may include fluid channels disposed below an upper layer so that the heat transfers directly from the docking station 117 to the substrate chuck 804.

When a substrate chuck is docked in a docking station 117, there may be places where surfaces of the substrate chuck and the docking station 117 touch and heat transfer is good and places where the surfaces do not touch and heat transfer across the intervening gap is poor. As illustrated in top-down views of an embodiment substrate chuck 904 and side-chuck docking station 118 in FIGS. 9A and 9B, a conformable heat transfer material 119 may be provided on surfaces of the docking station 117 where the substrate chuck 904 docks. The substrate chuck 904 of this embodiment may otherwise be similar to the prior embodiments.

FIG. 9A shows a top-down view of the substrate chuck 904 and side-chuck docking station 118 prior to docking. A conformable heat transfer material 119 may cover the surface of the side-chuck docking station 118. FIG. 9B shows a top-down view when the substrate chuck 904 is docked. During docking the substrate chuck 904 may compress the conformable heat transfer material 119 to provide a gap free, uniform heat conducting interface between the substrate chuck 904 and the side-chuck docking station 118. A conformable heat transfer material 119 may be a conductive gel, thermally conductive silicon and non-silicone elastomers for applications where heat must be conducted over large and variant gaps. An example of such materials include THERM-A-GAP™, GLPOLY thermal pad XK-P30, and others.

An example embodiment for processing wafers through an embodiment location-specific processing system 100 will now be described with reference to FIGS. 10A-10E and FIG. 11. FIGS. 10A-10E illustrate top-down block diagrams of process chamber 102 in an embodiment location-specific processing system 100 illustrating the major steps in processing wafers 106. Blocks in the flow diagram in FIG. 11 describe the steps in FIGS. 10A-10E. The embodiment substrate chuck 104 in the embodiment location-specific processing system 100 is designed to maintain chuck temperature within a predetermined range throughout the location-specific process. Between processing wafers 106, the embodiment substrate chuck 104 may be docked in the docking station 117 and parameters such as temperature of the substrate chuck 104 may be reset.

Figure 10A:
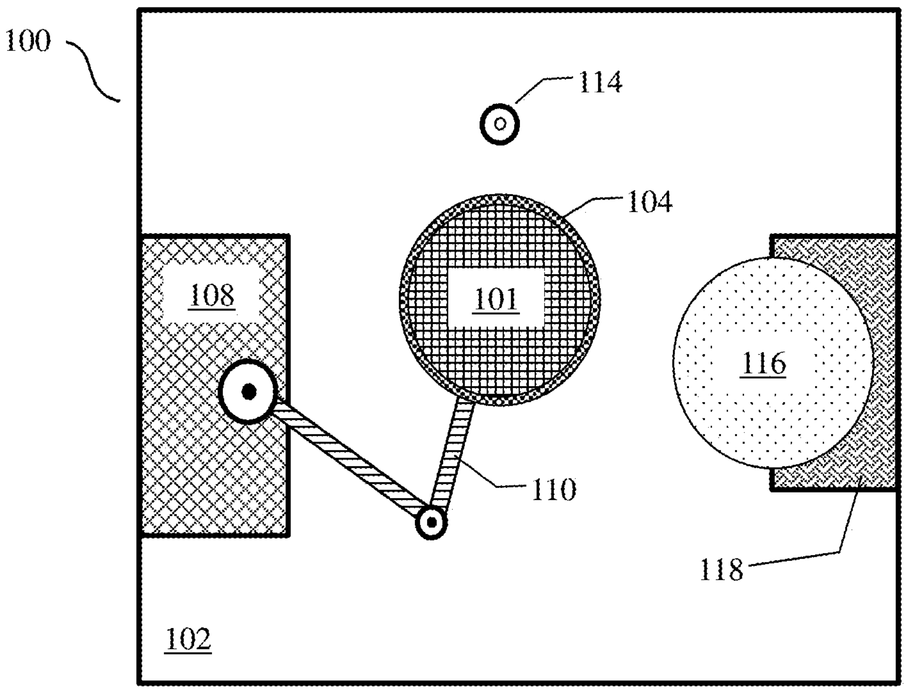
FIGS. 10A through 10E illustrate top-down views describing the major steps for processing wafers in a location-specific processing system in accordance with embodiments.
Figure 11:
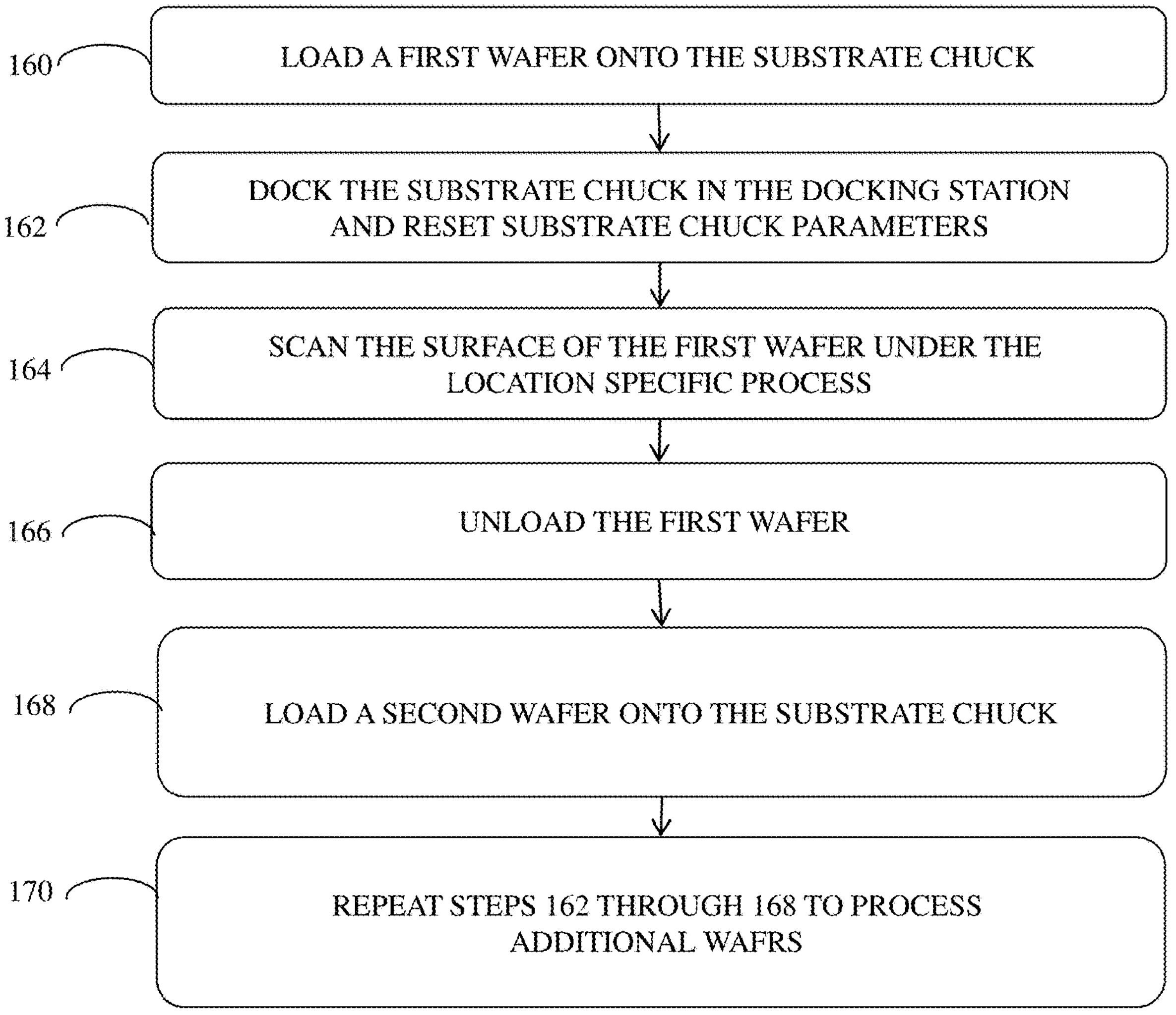
FIG. 11 illustrates a flow diagram with blocks describing the steps involved in processing wafer through a location-specific processing system illustrated in FIGS. 10A through 10E in accordance with embodiments.

In block 160 in FIG. 11, illustrated in the top-down block diagram in FIG. 10A, a first wafer 101 is loaded onto the substrate chuck 104 in the location-specific processing system 100. FIG. 11 will be described using substrate chuck 104 but is applicable all embodiment described above.

Figure 10B:
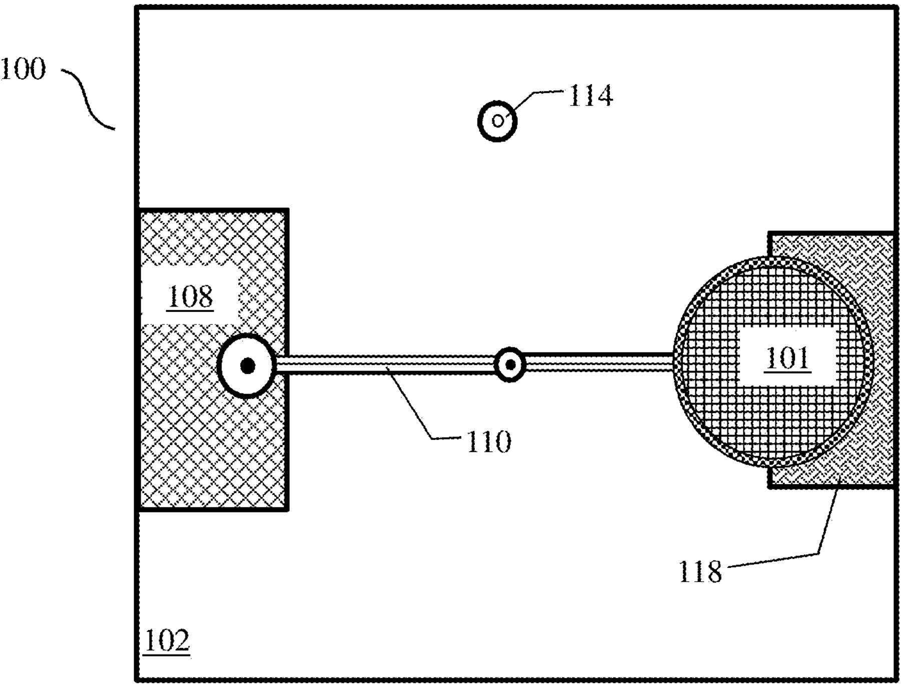

In block 162 in FIG. 11, illustrated in FIG. 10B, the chuck arm 110 docks the substrate chuck 104 in the side-chuck docking station 118. The side-chuck docking station 118 is used for illustration. A bottom-chuck docking station 116 (as previously described) or a combination bottom-docking and side-docking station may also be used. An alternative procedure may be to reset parameters in the substrate chuck 104 prior to loading the wafer 101. While the substrate chuck 104 is docked, the temperature may be reset to a processing temperature. In addition, a battery that provides power to a heater embedded in the chuck may be recharged, capacitors that provide voltages to electrostatic electrodes may be recharged, and gas may be replenished in a plenum in substrate chuck 104.

Figure 10C:
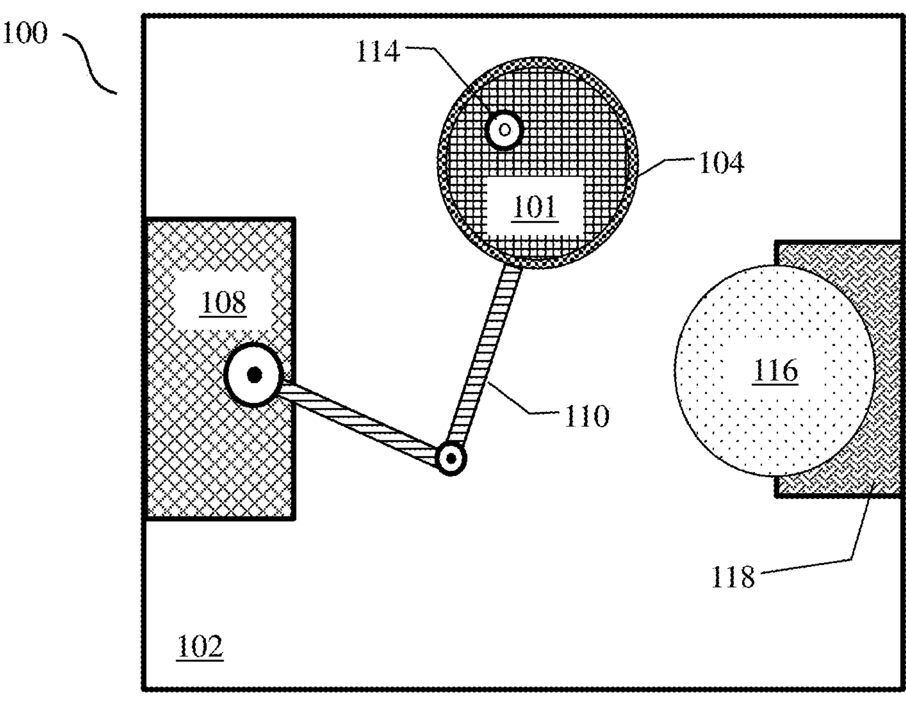

In block 164 in FIG. 11, illustrated in FIG. 10C, the chuck arm 110, driven by the process controller 108, moves the wafer 101 and the substrate chuck 104 under the location-specific nozzle 114. The location-specific process may be a process such as burnish process, an etching process, a deposition process, an ion-milling process, or a sputtering process. The process controller 108 may control the moving of wafer 101 so that he dwell time of the location-specific process is the same at all spots across the wafer 101. Wafer 101 may be scanned horizontally or vertically. Alternatively as described in FIGS. 2A and 2B, the substrate chuck 104 may rotate and the wafer 101 may be moved from center to edge as the wafer 101 rotates.

Figure 10D:
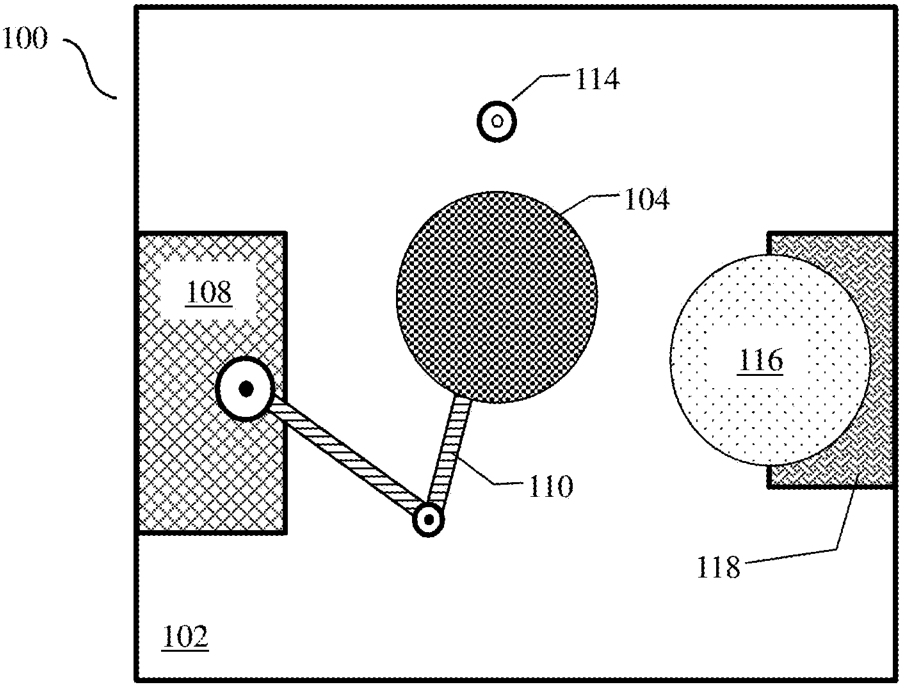

In block 166 in FIG. 11, illustrated in FIG. 10D, when the first wafer 101 processing is complete, the substrate chuck 104 may be removed from under the location-specific nozzle 114 and first wafer 101 may be unloaded.

Figure 10E:
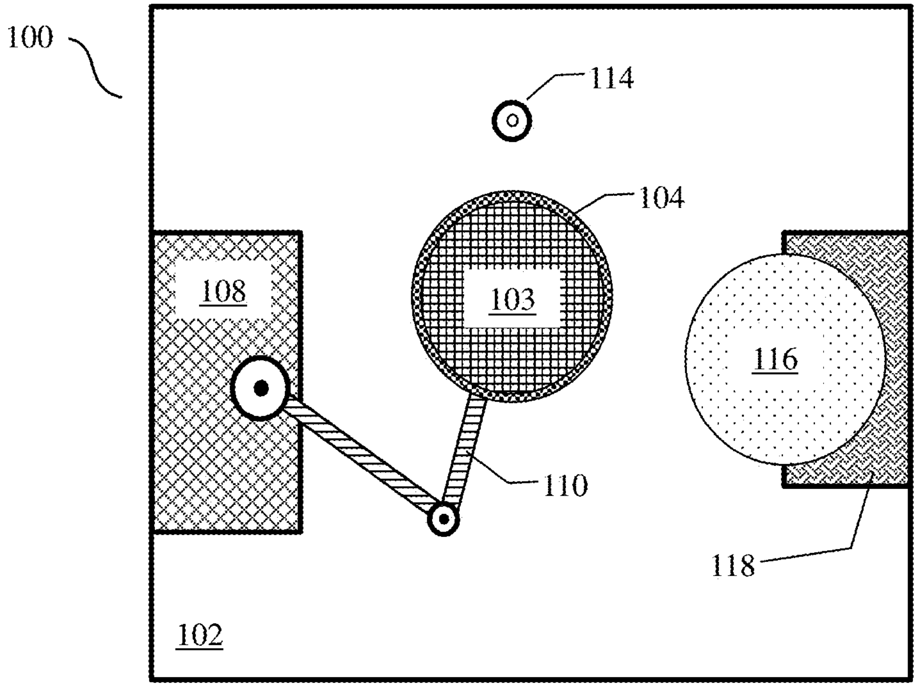

In block 168 in FIG. 11, illustrated in FIG. 10E, a second wafer 103 may be loaded onto the substrate chuck 104.

In block 170 in FIG. 11, blocks 162 through 168 may be repeated until all the wafers in the lot are processed.

Embodiment location-specific processing system 100 is designed with a substrate chuck 104 that maintains processing temperature within a specified range throughout a process. In the interval between processing wafers, the substrate chuck 104 may be docked in a docking station 117 in the location-specific processing system 100 and the temperature of the substrate chuck 104 may be reset. By providing a mobile substrate chuck that does not require heating or cooling to be supplied to the substrate chuck 104 through the chuck arm 110, complexity and cost is reduced, and reliability is improved. In another embodiment a chuck heater 134 and a battery 136 that supplies power to the chuck heater 134 may be embedded in the substrate chuck 104. The battery 136 may be recharged during docking. Containing the chuck heater 134 and the power source in the substrate chuck 104 reduces cost and improves reliability by not requiring power to be supplied to the chuck heater 134 through the chuck arm 110. In another embodiment, a gas plenum, 140 or 148, is coupled either internally or externally to the substrate chuck 104 to provide gas flow across the backside of the wafer 106 during processing. In the interval between processing wafers 106, when the substrate chuck 104 is docked, the gas in the plenum, 140 or 148, may be replenished. Providing the gas in the mobile substrate chuck 104 reduces cost and improves reliability by not requiring the flexible hoses and rotating valves needed to supply gas through the chuck arm 110.

Example embodiments of the present invention are summarized here. Other example embodiments can also be understood from the entirety of the specification and the claims filed herein.

Example 1. An apparatus includes a processing chamber and an equipment housing; a processing tool in the equipment housing with a process nozzle projecting into the processing chamber; a substrate chuck for supporting a wafer disposed in the processing chamber. The apparatus includes a docking station in the processing chamber configured to reset a temperature of the substrate chuck when the wafer is docked in a docking position; and a chuck arm in the processing chamber. The chuck arm is configured to move the wafer under the process nozzle and to move the wafer to the docking position.

Example 2. The apparatus of example 1, further includes a motor disposed below the substrate chuck, the substrate chuck being coupled to a rotating shaft of the motor, the substrate chuck being configured to rotate in response to rotation of the rotating shaft.

Example 3. The apparatus of one of examples 1 or 2, where the apparatus is a burnishing tool, a plasma etching tool, an ion milling tool, a deposition tool, or a sputtering tool.

Example 4. The apparatus of one of examples 1 to 3, where the substrate chuck includes aluminum, brass, stainless steel, AlBeMet, and Incoloy.

Example 5. The apparatus of one of examples 1 to 4, where the substrate chuck includes an electrostatic electrode and storage capacitors disposed in the substrate chuck to power the electrostatic electrode.

Example 6. The apparatus of one of examples 1 to 5, where the substrate chuck includes an electrostatic electrode and wires coupling the electrostatic electrode to a process controller through the chuck arm.

Example 7. The apparatus of one of examples 1 to 6, further including a coating covering a portion of a surface of the substrate chuck, the coating including a thermal blocking material to reduce radiative heat loss.

Example 8. The apparatus of one of examples 1 to 7, where the substrate chuck further includes a heater and a rechargeable battery and the docking station is configured to recharge the rechargeable battery.

Example 9. The apparatus of one of examples 1 to 8, where the substrate chuck further includes a gas plenum and the docking station is configured to recharge the gas plenum.

Example 10. The apparatus of one of examples 1 to 9, where outer surfaces of the substrate chuck and the docking station include corrugations, and where the corrugations on the docking station are configured to mate with the corrugations on the substrate chuck.

Example 11. The apparatus of one of examples 1 to 10, where the docking station further includes a conformable heat transfer material covering a docking area of the docking station.

Example 12. The apparatus of one of examples 1 to 11, where the docking station is configured to inject a temperature-controlled gas between the substrate chuck and the docking station when the substrate chuck is docked to facilitate heat transfer.

Example 13. The apparatus of one of examples 1 to 12, further includes a microcontroller in the substrate chuck, the microcontroller configured to receive data from a thermal sensor in the substrate chuck and send control signals to a valve in a gas channel between a gas plenum and the backside of the wafer to adjust a flow of the temperature-controlled gas.

Example 14. A method of processing wafers includes loading a first wafer onto a substrate chuck in a processing system, the processing system including a process nozzle, the substrate chuck, and a docking station. The method includes docking the substrate chuck with the docking station, the docking including moving the substrate chuck to a docketing position and setting a temperature for the substrate chuck. The method includes moving a surface of the first wafer under the process nozzle; unloading the first wafer; loading a second wafer onto the substrate chuck. The method includes repeating the docking, the moving, and the unloading to process the second wafer.

Example 15. The method of example 14, further includes in response to determining that the substrate chuck is docked, resetting the temperature of the substrate chuck by replenishing a gas in a plenum in the substrate chuck.

Example 16. The method of one of examples 14 to 15, further includes in response to determining that the substrate chuck is docked, recharging a battery in the substrate chuck.

Example 17. The method of one of examples 14 to 16, further includes in response to determining that the substrate chuck is docked, flowing a temperature-controlled gas between the docking station and the substrate chuck.

Example 18. A substrate chuck includes a high heat capacity substrate to support a wafer during processing; and a coating covering a portion of a surface of the substrate chuck, the coating including a thermal blocking material to reduce radiative heat loss.

Example 19. The substrate chuck of one of examples 18 to 18, where the substrate chuck includes aluminum, brass, stainless steel, AlBeMet, and Incoloy.

Example 20. The substrate chuck of one of examples 18 to 19, where the substrate chuck includes an electrostatic electrode and storage capacitors disposed in the substrate chuck to power the electrostatic electrode.

Example 21. The substrate chuck of one of examples 18 to 20, where the substrate chuck includes an electrostatic electrode and wires coupling the electrostatic electrode to a process controller.

Example 22. The substrate chuck of one of examples 18 to 21, further includes a gas plenum configured to be replenished with gas when docked.

Example 23. The substrate chuck of one of examples 18 to 22, further including a heater and a rechargeable battery in the substrate chuck.

Example 24. The substrate chuck of one of examples 18 to 23, where a bottom side of the substrate chuck includes a corrugated surface.

In the preceding description, specific details have been set forth, such as particular processes and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. An apparatus comprising:
- a processing chamber and an equipment housing;
- a processing tool in the equipment housing with a process nozzle projecting into the processing chamber;
- a substrate chuck for supporting a wafer disposed in the processing chamber;
- a docking station in the processing chamber configured to reset a temperature of the substrate chuck when the wafer is docked in a docking position; and
- a chuck arm in the processing chamber, the chuck arm being configured to move the wafer under the process nozzle and to move the wafer to the docking position.

2. An apparatus comprising
- a processing chamber and an equipment housing;
- a processing tool in the equipment housing with a process nozzle projecting into the processing chamber;
- a substrate chuck for supporting a wafer disposed in the processing chamber;
- a docking station in the processing chamber configured to reset a temperature of the substrate chuck when the wafer is docked in a docking position;
- a chuck arm in the processing chamber, the chuck arm being configured to move the wafer under the process nozzle and to move the wafer to the docking position; and
- a motor disposed below the substrate chuck, the substrate chuck being coupled to a rotating shaft of the motor, the substrate chuck being configured to rotate in response to rotation of the rotating shaft.

3. The apparatus of claim 1, wherein the apparatus is a burnishing tool, a plasma etching tool, an ion milling tool, a deposition tool, or a sputtering tool.

4. The apparatus of claim 1, wherein the substrate chuck comprises an electrostatic electrode and storage capacitors disposed in the substrate chuck to power the electrostatic electrode.

5. The apparatus of claim 1, wherein the substrate chuck comprises an electrostatic electrode and wires coupling the electrostatic electrode to a process controller through the chuck arm.

6. The apparatus of claim 1, further comprising a coating covering a portion of a surface of the substrate chuck, the coating comprising a thermal blocking material to reduce radiative heat loss.

7. The apparatus of claim 1, wherein the substrate chuck further comprises a heater and a rechargeable battery and the docking station is configured to recharge the rechargeable battery.

8. The apparatus of claim 1, further comprising a gas plenum and the docking station is configured to recharge the gas plenum.

9. The apparatus of claim 1, wherein outer surfaces of the substrate chuck and the docking station comprise corrugations, and wherein the corrugations on the docking station are configured to mate with the corrugations on the substrate chuck.

10. The apparatus of claim 1, wherein the docking station further includes a conformable heat transfer material covering a docking area of the docking station.

11. An apparatus comprising:
- a processing chamber and an equipment housing;
- a processing tool in the equipment housing with a process nozzle projecting into the processing chamber;
- a substrate chuck for supporting a wafer disposed in the processing chamber;
- a docking station in the processing chamber configured to reset a temperature of the substrate chuck when the wafer is docked in a docking position; and
- a chuck arm in the processing chamber, the chuck arm being configured to move the wafer under the process nozzle and to move the wafer to the docking position,
- wherein the docking station is configured to inject a temperature-controlled gas between the substrate chuck and the docking station when the substrate chuck is docked to facilitate heat transfer.

12. The apparatus of claim 2, wherein the apparatus is a burnishing tool, a plasma etching tool, an ion milling tool, a deposition tool, or a sputtering tool.

13. The apparatus of claim 2, wherein the substrate chuck comprises an electrostatic electrode and storage capacitors disposed in the substrate chuck to power the electrostatic electrode.

14. The apparatus of claim 2, wherein the substrate chuck comprises an electrostatic electrode and wires coupling the electrostatic electrode to a process controller through the chuck arm.

15. The apparatus of claim 2, further comprising a coating covering a portion of a surface of the substrate chuck, the coating comprising a thermal blocking material to reduce radiative heat loss.

16. The apparatus of claim 2, wherein the substrate chuck further comprises a heater and a rechargeable battery and the docking station is configured to recharge the rechargeable battery.

17. The apparatus of claim 2, further comprising a gas plenum and the docking station is configured to recharge the gas plenum.

18. The apparatus of claim 2, wherein outer surfaces of the substrate chuck and the docking station comprise corrugations, and wherein the corrugations on the docking station are configured to mate with the corrugations on the substrate chuck.

19. The apparatus of claim 2, wherein the docking station further includes a conformable heat transfer material covering a docking area of the docking station.

20. The apparatus of claim 11, wherein the substrate chuck comprises an electrostatic electrode and storage capacitors disposed in the substrate chuck to power the electrostatic electrode.

* * * * *